US012146014B2

(12) United States Patent
Arai

(10) Patent No.: US 12,146,014 B2
(45) Date of Patent: Nov. 19, 2024

(54) CURING AGENT COMPOSITION FOR CURING 2-METHYLENE-1,3-DICARBONYL COMPOUND

(71) Applicant: NAMICS CORPORATION, Niigata (JP)

(72) Inventor: Fuminori Arai, Niigata (JP)

(73) Assignee: NAMICS CORPORATION, Niigata (JP)

( * ) Notice: Subject to any disclaimer, the term of this patent is extended or adjusted under 35 U.S.C. 154(b) by 723 days.

(21) Appl. No.: 17/283,540

(22) PCT Filed: Oct. 8, 2019

(86) PCT No.: PCT/JP2019/039628
§ 371 (c)(1),
(2) Date: Apr. 7, 2021

(87) PCT Pub. No.: WO2020/075707
PCT Pub. Date: Apr. 16, 2020

(65) Prior Publication Data
US 2021/0388128 A1 Dec. 16, 2021

(30) Foreign Application Priority Data

Oct. 9, 2018 (JP) ................................ 2018-190817

(51) Int. Cl.
*C08F 22/14* (2006.01)
*C08F 2/44* (2006.01)
*C08K 5/17* (2006.01)

(52) U.S. Cl.
CPC ................ *C08F 22/14* (2013.01); *C08F 2/44* (2013.01); *C08K 5/17* (2013.01)

(58) Field of Classification Search
CPC ............... C08F 22/14; C08F 2/44; C08K 5/17
See application file for complete search history.

(56) References Cited

U.S. PATENT DOCUMENTS

| | | | |
|---|---|---|---|
| 4,160,864 A | 7/1979 | Ponticello et al. | |
| 4,182,823 A | 1/1980 | Schoenberg | |
| 9,181,365 B2 | 11/2015 | Malofsky et al. | |
| 9,249,265 B1 | 2/2016 | Stevenson et al. | |
| 9,279,022 B1 | 3/2016 | Palsule et al. | |
| 9,676,875 B2 | 6/2017 | Palsule et al. | |
| 9,752,059 B2 | 9/2017 | Malofsky et al. | |
| 9,790,295 B2 | 10/2017 | Sullivan et al. | |
| 9,969,819 B2 | 5/2018 | Palsule et al. | |
| 10,081,685 B2 | 9/2018 | Stevenson et al. | |
| 10,167,348 B2 | 1/2019 | Palsule et al. | |
| 10,607,910 B2 | 3/2020 | Malofsky et al. | |
| 11,230,617 B2 * | 1/2022 | Arai | H01L 27/14625 |
| 11,773,301 B2 * | 10/2023 | Sato | C08F 122/14 |
| | | | 526/195 |
| 2002/0027294 A1 | 3/2002 | Neuhaus et al. | |
| 2014/0221532 A1 | 8/2014 | Wu et al. | |
| 2014/0329926 A1 | 11/2014 | Kirino | |
| 2015/0073110 A1 | 3/2015 | Malofsky et al. | |
| 2015/0104660 A1 | 4/2015 | Malofsky et al. | |
| 2015/0210894 A1 | 7/2015 | Malofsky et al. | |
| 2015/0303122 A1 | 10/2015 | Malofsky et al. | |
| 2015/0361283 A1 | 12/2015 | Malofsky et al. | |
| 2016/0068621 A1 | 3/2016 | Sullivan et al. | |
| 2016/0096906 A1 | 4/2016 | Palsule et al. | |
| 2017/0240657 A1 | 8/2017 | Palsule et al. | |
| 2017/0253675 A1 | 9/2017 | Palsule et al. | |
| 2020/0148922 A1 | 5/2020 | Arai et al. | |
| 2020/0219781 A1 | 7/2020 | Malofsky et al. | |
| 2020/0283551 A1 | 9/2020 | Arai et al. | |

FOREIGN PATENT DOCUMENTS

| | | |
|---|---|---|
| EP | 2792694 A1 | 10/2014 |
| EP | 2926368 A1 | 10/2015 |
| JP | S5331740 A | 3/1978 |
| JP | 2004504730 A | 2/2004 |
| JP | 2007177014 A | 7/2007 |
| JP | 2014531505 A | 11/2014 |
| JP | 2015512460 A | 4/2015 |
| JP | 2015517973 A | 6/2015 |
| JP | 2015519416 A | 7/2015 |
| JP | 2016506072 A | 2/2016 |
| JP | 2017036361 A | 2/2017 |
| JP | 2017526791 A | 9/2017 |
| JP | 2017527667 A | 9/2017 |
| JP | 2017527668 A | 9/2017 |
| JP | 2018517809 A | 7/2018 |
| WO | 2013059473 A2 | 4/2013 |
| WO | 2014078689 A1 | 5/2014 |

(Continued)

OTHER PUBLICATIONS

Notice of Allowance dated May 19, 2023, issued in related U.S. Appl. No. 17/282,696.
Extended European Search Report (EESR) dated Jun. 21, 2021 issued in European Application No. 18871993.4.
Notice of Allowance dated Oct. 12, 2021 issued in related U.S. Appl. No. 16/759,886.
International Search Report (ISR) (and English translation thereof) dated Dec. 24, 2019 issued in International Application No. PCT/JP2019/039628.
Written Opinion dated Dec. 24, 2019 issued in International Application No. PCT/JP2019/039628.

(Continued)

*Primary Examiner* — Angela C Scott

(74) *Attorney, Agent, or Firm* — Holtz, Holtz & Volek PC

(57) ABSTRACT

A curing agent composition is capable of curing a base resin containing a 2-methylene-1,3-dicarbonyl compound. The curing agent composition contains a specific 2-methylene-1,3-dicarbonyl compound and an initiator. A two-part mixing adhesive contains the curing agent composition and a base resin containing another specific 2-methylene-1,3-dicarbonyl compound.

14 Claims, No Drawings

(56) References Cited

FOREIGN PATENT DOCUMENTS

| WO | 2014085570 A1 | 6/2014 |
|---|---|---|
| WO | 2016040261 A1 | 3/2016 |
| WO | 2016205605 A1 | 12/2016 |
| WO | 2018212330 A1 | 11/2018 |
| WO | 2019088102 A1 | 5/2019 |
| WO | 2019137853 A1 | 7/2019 |

OTHER PUBLICATIONS

Chinese Office Action (and English language translation thereof) dated Dec. 23, 2020 issued in Chinese Application No. 201880070166.7.

International Search Report (ISR) (and English translation thereof) dated Jan. 15, 2019 issued in International Application No. PCT/JP2018/040337.

International Search Report (ISR) (and English translation thereof) dated Nov. 5, 2019 issued in International Application No. PCT/JP2019/039261.

Written Opinion Jan. 15, 2019 issued in International Application No. PCT/JP2018/040337.

Related U.S. Appl. No. 16/759,886, First Named Inventor: Fuminori Arai; Title: "Resin Composition"; filed Apr. 28, 2020.

Related U.S. Appl. No. 17/282,696, First Named Inventor: Ayako Sato; Title: "Resin Composition"; filed Apr. 2, 2021.

Written Opinion dated Nov. 5, 2019 issued in International Application No. PCT/JP2019/039261.

U.S. Appl. No. 17/768,883, First Named Inventor: Ayako Sato; Title: "Polymerizable Composition and Curable Resin Composition Using Same"; filed Apr. 14, 2022.

Extended European Search Report (EESR) dated Jun. 10, 2022, issued in European Application No. 19868347.6.

* cited by examiner

CURING AGENT COMPOSITION FOR CURING 2-METHYLENE-1,3-DICARBONYL COMPOUND

TECHNICAL FIELD

The present invention relates to a curing agent composition comprising a specific 2-methylene-1,3-dicarbonyl compound, a two-part mixing adhesive comprising the same and another specific 2-methylene-1,3-dicarbonyl compound, and a method for curing another specific 2-methylene-1,3-dicarbonyl compound using the same.

BACKGROUND ART

Currently, adhesives, sealing materials, and others comprising curable compositions are often used in the assembly and mounting of electronic components used in semiconductor devices for such purposes as maintaining reliability. Among semiconductor devices, electronic devices such as cell phones and smart phones, in particular, are composed of various electronic modules such as cameras, displays, audio, sensors, batteries, vibrators, and the like. Many of the components of these electronic nodules contain materials whose mechanical and electronic properties, positional accuracy and other characteristics are adversely affected by heat and it is desirable to assemble these electronic modules and to assemble and seal electronic devices under relatively low temperature conditions of 80° C. or lower. Therefore, the adhesives and sealing materials used in the manufacture of the electronic devices and modules above are required to show sufficient curability even under low temperature conditions. At the same time, they also need to be capable of curing in a short period of time in view of production costs.

In general, curable compositions are classified into one-part systems and two-part mixing systems. A two-part mixing curable composition system is composed of two liquid compositions: a base resin and a curing agent. Each of these by itself remains effectively unchanged and liquid for a certain period of time, but upon mixing them, a curing reaction proceeds in a short period of time, resulting in solidification. In general, the base resin and curing agent are mixed just before use. Epoxy-based, urethane-based and other curable compositions are known in the art as two-part mixing curable compositions (Patent Document 1).

In recent years, there has been a need for curing systems that are capable of curing in a short time even at low temperatures such as room temperature. Patent Document 2 discloses a polymerization system comprising a diethyl methylene malonate monomer (DEMM) and a polymerization activator carried in inactive engagement. However, no two-part mixing curable composition systems are known in the art that comprise such methylene malonate monomers as curing agents.

PRIOR ART DOCUMENTS

Patent Documents

Patent Document 1: Japanese Translation of PCT International Application Publication No. JP-T-2014-531505
Patent Document 2: Japanese Translation of PCT International Application Publication No. JP-T-2015-512460

SUMMARY OF THE INVENTION

Problems to be Solved by the Invention

In two-part mixing curable composition systems, curing is typically achieved by mixing the curing agent and the base resin in a certain ratio. If they are mixed in an improper ratio, sufficient curing may not be attained or the cured product may not exhibit the desired physical properties. However, it is not always easy to mix them in precise ratios, and there is also a possibility that mixing in an improper ratio may result from human error.

For example, when applying a two-part mixing curable composition system to the surface (especially a small area thereof) of an adherend, a dispenser is often used that has a plurality of removable syringe-like containers that can hold liquid, an extrusion mechanism that extrudes the liquids in the syringe-like containers by air pressure, a liquid reservoir that can receive and mix the plurality of liquids extruded from the syringe-like containers, and a nozzle in fluid communication therewith for discharging the liquid in the liquid reservoir.

In this case, the two-part mixing curable composition system is applied to the adherend by filling one of the syringe-like containers removed from the dispenser with the curing agent and the other with the base resin, and then reattaching them to the dispenser; mixing, in the liquid reservoir, predetermined amounts of the curing agent and the base resin extruded from the syringe-like containers; and discharging the resulting mixture from the nozzle to apply it to the adherend. However, in such a method, there is a possibility that the curing agent and the base resin are mixed in an improper ratio, due to reasons such as an incorrectly set air pressure for one of the containers or accidentally attaching the wrong syringe-like containers as a result of a mix-up of the curing agent and the base resin. Furthermore, if the curing agent and the base resin contain a large amount of liquid components that do not contribute to the curing reaction, there is an increased risk of outgassing and bleeding from the cured product, even if sufficient mixing is achieved.

It is an object of the present invention to provide a curing agent composition capable of curing, without inconvenience, a base resin comprising a 2-methylene-1,3-dicarbonyl compound, and a two-part mixing adhesive and the like comprising the same, in order to solve the problems of the prior art described above.

Solution to the Problems

As a result of intensive research to solve the above-mentioned problems, the present inventor has arrived at the present invention.

That is, the present invention includes, but is not limited to, the following inventions.

1. A curing agent composition, comprising:
   (a) an initiator comprising at least one basic substance, and
   (b) at least one 2-methylene-1,3-dicarbonyl compound having a molecular weight of 180 or higher and 10,000 or lower,
   wherein the 2-methylene-1,3-dicarbonyl compound is a compound comprising at least one structural unit represented by formula (I) below.

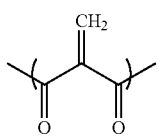

(I)

2. The curing agent composition according to preceding item 1, wherein the component (a) has a $pK_a$ of 8.0 or higher.

3. The curing agent composition according to preceding item 1 or 2, wherein the component (a) is an amine compound.

4. The curing agent composition according to any one of preceding items 1 to 3, wherein the component (a) is a tertiary amine compound.

5. The curing agent composition according to any one of preceding items 1 to 4, wherein the component (a) is at least one tertiary amine compound represented by the formula NRR'R", wherein R and R' are each, independently, a methyl group or an ethyl group, and R" is a monovalent hydrocarbon group having two or more carbon atoms.

6. The curing agent composition according to any one of preceding items 1 to 5, for curing a base resin comprising the following component (b2):
(b2) at least one 2-methylene-1,3-dicarbonyl compound.

7. The curing agent composition according to any one of preceding items 1 to 6, wherein the curing agent composition has a viscosity of 1,000 Pa·s or lower upon being maintained at 25° C. for 12 hours.

8. A two-part mixing adhesive comprising:
(i) the curing agent composition according to any one of preceding items 1 to 7, and
(ii) a base resin comprising the following component (b2):
(b2) at least one 2-methylene-1,3-dicarbonyl compound;
wherein the 2-methylene-1,3-dicarbonyl compound is a compound comprising at least one structural unit represented by formula (I) below.

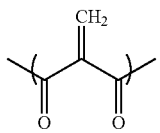

(I)

9. The two-part mixing adhesive according to preceding item 8, for electronic components.

10. A method for curing a base resin, comprising:
bringing the base resin into contact with the curing agent composition according to any one of preceding items 1 to 7;
wherein the base resin comprises (b2) at least one 2-methylene-1,3-dicarbonyl compound, and
wherein the 2-methylene-1,3-dicarbonyl compound is a compound comprising at least one structural unit represented by formula (I) below.

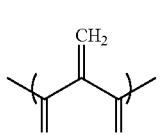

(I)

Effect of the Invention

Although the curing agent composition of the present invention remains uncured and liquid for a long time, when this composition is mixed with a base resin comprising a 2-methylene-1,3-dicarbonyl compound, the resulting mixture cures in a reasonable curing time even at relatively low temperatures such as room temperature. In other words, the curing agent composition of the present invention is extremely useful, because, when combined with the base resin described above, it provides a two-part mixing adhesive that can be conveniently and effectively used as an adhesive or sealing agent. In addition, such a two-part mixing adhesive allows the mixing ratio between the curing agent composition and the base resin to be set to any desired level, for example, 1:1 by volume, which enables mixing at improper ratios to be averted. Also, even if the actual ratio between the curing agent composition and the base resin deviates to some extent from the desired ratio, it still achieves the desired curability and the desired properties of the cured product. Furthermore, the cured product contains no liquid components that separate without being incorporated into the polymerization system, thereby preventing outgassing and bleeding.

DESCRIPTION OF EMBODIMENTS

Embodiments of the prevent invention are described in detail below.

The curing agent composition of the present invention comprises components (a) and (b1) below:
(a) an initiator comprising at least one basic substance, and
(b1) at least one 2-methylene-1,3-dicarbonyl compound having a molecular weight of 180 or higher and 10,000 or lower,
wherein the 2-methylene-1,3-dicarbonyl compound is a compound comprising at least one structural unit represented by formula (I) below.

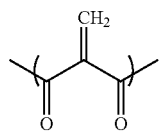

(I)

Components (a) and (b1) will be described below.
[Initiator (Component (a))]

The curing agent composition of the present invention comprises an initiator (component (a)). Component (a) is expected to contribute to the initiation of the reaction when 2-methylene-1,3-dicarbonyl compounds are polymerized by the Michael addition reaction. For the basic substance used for component (a) in the present invention, a single basic substance may be used alone, or two or more may be used in combination.

The basic substance used for component (a) in the present invention typically comprises an organic base, an inorganic base, or an organometallic compound.

Examples of the organic base include amine compounds, described below, and the like. Examples of the inorganic base include alkali metal hydroxides such as lithium hydroxide, sodium hydroxide, potassium hydroxide and cesium hydroxide; alkaline earth metal hydroxides such as calcium hydroxide; alkali or alkaline earth metal carbonates such as lithium carbonate, potassium carbonate and sodium carbonate; metal hydrogen carbonates such as potassium hydrogen carbonate and sodium hydrogen carbonate; and the like. Examples of organic metal compounds include organic alkali metal compounds such as butyllithium, t-butyllithium, phenyllithium, triphenylmethylsodium, and ethylsodium; organic alkaline earth metal compounds such as methyl magnesium bromide, dimethyl magnesium, phenyl magnesium chloride, phenyl calcium bromide, bis(dicyclopentadiene)calcium; and alkoxides such as sodium methoxide and t-butyl methoxide; and carboxylates such as sodium benzoate and the like.

When the curing agent composition of the present invention is used for an electronic material, if the curing agent composition comprises an inorganic base or an organometallic material, there is concern that it may have unintended impact on electrical characteristics in the electrical or electronic circuit in its vicinity. Therefore, the basic substance used in the present invention is preferably free of an alkali metal, an alkaline earth metal, a transition metal, or a halogen. In another embodiment, the basic substance used in the present invention is non-ionic.

The basic substance used for component (a) in the present invention is preferably an organic base, and more preferably an amine compound. The amine compound is an organic compound having at least one of a primary amino group, a secondary amino group, and a tertiary amino group within the molecule, and may have two or more amino groups of different classes within the same molecule at the same time.

Examples of compounds having a primary amino group include, for example, methylamine, ethylamine, propylamine, butylamine, ethylenediamine, propylenediamine, hexamethylenediamine, diethylenetriamine, triethylenetetramine, ethanolamine, propanolamine, cyclohexylamine, isophorone diamine, aniline, toluidine, diaminodiphenylmethane, diaminodiphenylsulfone and the like.

Examples of compounds having a secondary amino group include, for example, dimethylamine, diethylamine, dipropylamine, dibutylamine, dipentylamine, dihexylamine, dimethanolamine, diethanolamine, dipropanolamine, dicyclohexylamine, piperidine, piperidone, diphenylamine, phenylmethylamine, phenylethylamine and the like.

Examples of compounds having a tertiary amino group include, for example, triethylamine, tributylamine, trihexylamine, triallylamine, 3-diethylaminopropylamine, dibutylaminopropylamine, tetramethylethylenediamine, tri-n-octylamine, dimethylaminopropylamine, N,N-dimethylethanolamine, triethanolamine, N,N-diethylethanolamine, N-methyl-N,N-diethanolamine, N,N-dibutylethanolamine, triphenylamine, 4-methyltriphenylamine, 4,4-dimethyltriphenylamine, diphenylethylamnine, diphenylbenzylamine, N,N-diphenyl-p-anisidine, 1,1,3,3-tetramethylguanidine, N,N-dicyclohexylmethylamine, 1,4-diazabicyclo[2.2.2]octane, 2,6,10-trimethyl-2,6,10-triazaundecane, 1-benzylpiperidine, N,N-dimethylbenzylamine, N-ethyl-N-methylbenzylamine, N,N-diethylbenzylamine and the like.

Examples of compounds having two or more different amino groups at the same time within the same molecule include, but are not limited to, a guanidine compound, used as a raw material in an embodiment of the present invention, an imidazole compound and the like. Examples of the guanidine compound include dicyandiamide, methylguanidine, ethylguanidine, propylguanidine, butylguanidine, dimethylguanidine, trimethylguanidine, phenylguanidine, diphenylguanidine, tolylguanidine, 1,1,3,3-tetramethylguanidine and the like. Examples of the imidazole compound include 2-ethyl-4-methylimidazole, 2-methylimidazole, 2-heptadecylimidazole, 2-phenyl-4,5-dihydroxymethylimidazole, 2-undecylimidazole, 2-phenyl-4-methyl-5-hydroxymethylimidazole, 2-phenyl-4-benzyl-5-hydroxymethylimidazole, 2,4-diamino-6-(2-methylimidazolyl-((1))-ethyl-s-triazine, 2,4-diamino-6-(2'-methylimidazolyl-(I'))-ethyl-s-triazine/isocyanuric acid adduct, 2-methylimidazole, 2-phenylimidazole, 2-phenyl-4-methylimidazole, 1-cyanoethyl-2-phenylimidazole, 1-cyanoethyl-2-methylimidazole-trimellitate, 1-cyanoethyl-2-phenylimidazole-trimellitate, N-(2-methylimidazolyl-1-ethyl)-urea, and N,N'-(2-methylimidazolyl-(1)-ethyl)-adipoyldiamide. However, the imidazole compound is not limited to these compounds.

The amine compound above preferably comprises a secondary or tertiary amino group. If the amino group contained in the amine compound is primary, there is an increased likelihood that activated hydrogen generated from the amino group suppresses the polymerization reaction. The amine compound above more preferably comprises a tertiary amino group. In other words, the amine compound is more preferably a tertiary amine compound.

The amine compound above is preferably free of an alkali metal, an alkaline earth metal, a transition metal or a halogen.

The amine compound above is preferably free of groups comprising active hydrogen such as a hydroxy group and a sulfhydryl group.

In the present invention, if the basic substance separates as a solid phase or a liquid phase when a mixture of the curing agent composition and the base resin described below is cured, the reaction proceeds at the phase interface of basic substance and does not extend throughout the entire mixture, resulting in uneven curing. For this reason, the basic substance is preferably compatible with the liquid component in the curing agent composition.

The degree of effectiveness of component (a) as an initiator affects the rate of polymerization of 2-methylene-1,3-dicarbonyl compounds.

The Michael addition reaction discussed above is initiated by the donation of an electron from the basic moiety of component (a) to the reactive moiety (exo-methylene carbon) in a 2-methylene-1,3-dicarbonyl compound. The degree of effectiveness of component (a) as an initiator, therefore, is affected by the electron-donating strength of component (a), i.e., its strength of basicity, and the ease with which component (a) can approach the reactive moiety. The easier this approach or the stronger the basicity of component (a), the higher its effectiveness as an initiator and the higher the rate of polymerization.

In general, the basicity of a basic substance can be evaluated (measured) by the acid dissociation exponent $pK_a$, or $-\log K_a$, which is the common logarithm of the reciprocal of $K_a$, which is the acid dissociation constant between the basic substance in neutral form and its conjugate acid. The $pK_a$ of the conjugate acid of a basic substance or a basic group may simply be referred to herein as the $pK_a$ of the basic substance or the basic group.

The $pK_a$ of component (a) used in the present invention is preferably 8.0 or greater, more preferably 8.5 or greater, even more preferably 9 or greater, particularly preferably 10 or greater, and most preferably 11 or greater. If the $pK_a$ of component (a) is less than 8.5, the curing of a mixture obtained by mixing the curing agent composition with the base resin described below may be extremely slow. This is presumably because the steric hindrance in the vicinity of the reactive moiety is relatively large in components (b1) and (b2), which will be described later, and the initiation of the polymerization reaction does not occur readily when the $pK_a$ of component (a) is below a certain value.

The acid dissociation exponent ($pK_a$) between a basic substance in neutral form and its conjugate acid, described above, can be determined as appropriate by methods known to those skilled in the art, such as an electrochemical method and a spectroscopic method. As used herein, unless otherwise specified, "$pK_a$" refers to the value of $pK_a$ estimated by the software MarvinSketch 17.22.0, developed by ChemAxon, on the basis of the chemical structure with water selected as the solvent, using the following settings: Temperature: 298 K, Mode: macro, Acid/base prefix: static. However, if the basic substance of interest has a plurality of basic sites such as amino groups within the single molecule, the largest $pK_a$ value is employed as the $pK_a$ of the basic substance. If a plurality of basic sites exhibiting the largest $pK_a$ exist at equivalent positions in the structure of the molecule, the number of these equivalent basic sites exhibiting the largest $pK_a$ is defined as N.

By contrast, the ease with which component (a) approaches the reactive moiety depends on the interaction between component (a) and the 2-methylene-1,3-dicarbonyl compound, especially the steric hindrance exhibited by component (a) as a whole molecule and the steric hindrance in the vicinity of the reactive moiety described above. As discussed below, component (b1) and component (b2) differ in the suitable rate of polymerization, and, therefore, component (a) is selected taking into account the suitable rate of polymerization for each component. In an embodiment, the basic substance as component (a) is at least one tertiary amine compound represented by the formula NRR'R", wherein R and R' are each, independently, a methyl group or an ethyl group, and R" is a monovalent hydrocarbon group having two or more carbon atoms. Such tertiary amine compounds can be preferably used as component (a), because they allow a suitable polymerization rate to be obtained for the 2-methylene-1,3-dicarbonyl compound of each of components (b1) and (b2).

In the tertiary amine compound having the structure described above, R" is preferably a monovalent hydrocarbon group having 2 to 12 carbon atoms, because this provides a suitable difference in curing time between component (b1) and component (b2). The carbon number of R" is more preferably 2 to 7, and even more preferably 4 to 7.

The amine functional group equivalent weight of the amine compound used as component (a) is preferably less than 300, more preferably less than 200, even more preferably less than 180, even more preferably less than 170, even more preferably less than 140, particularly preferably less than 120. An amine functional group equivalent weight of less than 300 results in the amine compound having high curability, and an amine functional group equivalent weight of less than 180 results in even higher curability. As used herein, "amine functional group equivalent weight" is the value obtained by dividing the molecular weight of one molecule of an amine compound by N, which is the number of the amino groups that are contained in the amine compound and whose conjugate acids have the largest $pK_a$. For example, 1,4-diazabicyclo[2.2.2]octane (DABCO) has two amino groups within the molecule, and these amino groups are structurally equivalent, which means, for DABCO, N=2. In the case of 1,1,3,3-tetramethylguanidine, there are three amino groups within the molecule, and among these, the amino group exhibiting the largest $pK_a$ is the secondary amino group, and it follows that N=1.

The molecular weight of the amine compound used as component (a) is preferably from 100 to 1,000, more preferably from 100 to 500, and even more preferably from 110 to 300. If the molecular weight of the amine compound is less than 100, its volatility is high, giving rise to concern that, among other things, this may affect components in the vicinity and cause the cured product to have inconsistent physical properties. If the molecular weight of the amine compound exceeds 1,000, this may lead to, among other things, an increased viscosity of, and a decreased dispersibility in the curing agent composition of, the amine compound. The molecular weight of the amine compound used as component (a) is determined, for example, by analyzing its molecular structure by means of reverse phase high performance liquid chromatography (reverse phase HPLC) using an ODS column for the column and a mass spectrometer (MS) for the detector.

Specific examples of amine compounds that are suitable for component (a) include, but are not limited to, triethylamine, 1,4-diazabicyclo[2.2.2]octane, 1,1,3,3-tetramethylguanidine, N,N-dimethylbenzylamine, N,N-diethylbenzylamine, 1-benzylpiperidine, N,N-dicyclohexylmethylamine, 2,6,10-trimethyl-2,6,10-triazaundecane, N,N-dimethyloctylamine, and N,N-dimethyloctadecylamine.

Component (a) of the present invention may be such that that it has been rendered inactivated by separation or latentization and can be activated by any stimulus such as heat, light, mechanical shear, or the like. More specifically, the initiator may be a latent curing catalyst such as a microcapsule, or those based on ion dissociation or an inclusion compound, and may be in a form that generates a base upon exposure to heat, light, electromagnetic waves, ultrasonic waves, or physical shear.

In the present invention, the amount of component (a) is preferably 0.01% to 30% by mass, and more preferably 0.01% to 10% by mass, relative to the total amount of the curing agent composition. If the amount of component (a) is less than 0.01% by mass, curing will become inconsistent. Conversely, if the amount of component (a) is higher than 30% by mass, a large amount of component (a) that has not formed chemical bonds with the resin matrix will remain in the cured product, causing deterioration of physical properties of the cured product, bleeding and other problems. The amount of component (a) relative to the total amount of the curing agent composition can be determined, for example, by means of reverse phase HPLC, discussed above, using an ODS column for the column and a mass spectrometer (MS) for the detector with PDA (detection wavelength: 190 nm to 800 nm) or ELSD quantification.

2-Methylene-1,3-dicarbonyl compound

The curing agent composition of the present invention comprises a 2-methylene-1,3-dicarbonyl compound. The curing agent composition of the present invention is particularly suitable for curing 2-methylene-1,3-dicarbonyl compounds, as described below. A 2-methylene-1,3-dicarbonyl compound is a compound comprising at least one structural unit represented by formula (I) below.

(I)

In the following, this 2-methylene-1,3-dicarbonyl compound will be described.

Since the 2-methylene-1,3-dicarbonyl compound comprises the structural unit of formula (I) above, it is polymerized by Michael addition in the presence of an initiator, typically a basic substance (component (a) above). The 2-methylene-1,3-dicarbonyl compound comprises one, or two or more of structural units of formula (I) above. In some embodiments, the 2-methylene-1,3-dicarbonyl compound comprises two to six, preferably two, structural units of formula (I) above.

In an embodiment, the 2-methylene-1,3-dicarbonyl compound is represented by formula (II) below:

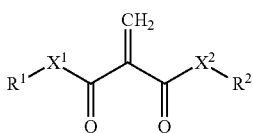

(II)

wherein
$X^1$ and $X^2$ each, independently, represent a single bond, O or $NR^3$, wherein $R^3$ represents hydrogen or a monovalent hydrocarbon group; and
$R^1$ and $R^2$ are each, independently, hydrogen, a monovalent hydrocarbon group, or represented by formula (III) below:

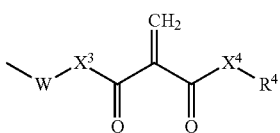

(III)

wherein
$X^3$ and $X^4$ each, independently, represent a single bond, O or $NR^5$, wherein $R^5$ represents hydrogen or a monovalent hydrocarbon group;
W represents a spacer; and
$R^4$ represents hydrogen or a monovalent hydrocarbon group.

In an embodiment, the 2-methylene-1,3-dicarbonyl compound is represented by formula (IV) below:

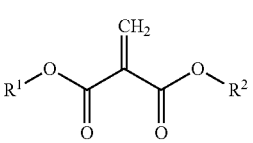

(IV)

wherein R' and R' are each, independently, hydrogen, a monovalent hydrocarbon group, or represented by formula (V) below:

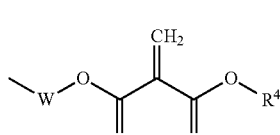

(V)

wherein
W represents a spacer; and
$R^4$ represents hydrogen or a monovalent hydrocarbon group.

In another embodiment, the 2-methylene-1,3-dicarbonyl compound is a dicarbonylethylene derivative represented by formula (VI) below:

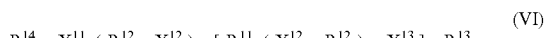

(VI)

wherein
$R^{11}$ represents a 1,1-dicarbonylethylene unit represented by formula (VII) below:

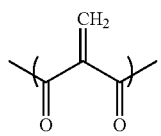

(VII)

each $R^{12}$ each, independently, represents a spacer;
$R^{13}$ and $R^{14}$ each, independently, represent hydrogen or a monovalent hydrocarbon group;
$X^{11}$ and each $X^{12}$ and $X^{13}$ each, independently, represent a single bond, O or $NR^{15}$, wherein $R^{15}$ represents hydrogen or a monovalent hydrocarbon group;
each m each, independently, represents 0 or 1; and
n represents an integer of 1 or greater and 20 or less;

As used herein, a monovalent hydrocarbon group refers to the group that results if one hydrogen atom is removed from a carbon atom in a hydrocarbon. Examples of the monovalent hydrocarbon group include an alkyl group, an alkenyl group, an alkynyl group, a cycloalkyl group, an alkyl-substituted cycloalkyl group, an aryl group, an aralkyl group, and an alkaryl group, and some of these may comprise heteroatoms such as N, O, S, P and Si.

Each of the monovalent hydrocarbon groups above may be substituted with alkyl, cycloalkyl, heterocyclyl, aryl, heteroaryl, allyl, alkoxy, alkylthio, hydroxyl, nitro, amide, azide, cyano, acyloxy, carboxy, sulfoxy, acryloxy, siloxy, epoxy, or ester.

The monovalent hydrocarbon group is preferably an alkyl group, a cycloalkyl group, an aryl group, or an alkyl group substituted with a cycloalkyl group, more preferably, an alkyl group, a cycloalkyl group, or an alkyl group substituted with a cycloalkyl group.

There are no particular restrictions on the carbon number of the alkyl group, alkenyl group, and alkynyl group (hereinafter collectively referred to as the "alkyl group etc."). The carbon number of the alkyl group is typically 1 to 12, preferably 2 to 10, more preferably 3 to 8, even more preferably 4 to 7, particularly preferably 5 to 6. The carbon number of the alkenyl group and the alkynyl group is typically from 2 to 12, preferably from 2 to 10, more preferably from 3 to 8, even more preferably from 3 to 7, and particularly preferably from 3 to 6. If the alkyl group etc. have a cyclic structure, the number of carbon atoms in the alkyl group etc. is typically 4 to 12, preferably 4 to 10, more preferably 5 to 8, even more preferably 6 to 8. The carbon number of the alkyl group etc. can be identified by, for example, reverse phase HPLC, described above, or nuclear magnetic resonance (NMR).

There are no particular restrictions on the structure of the alkyl group etc. The alkyl group etc. may be linear or may have a side chain. The alkyl group etc. may have a chain structure or a cyclic structure (a cycloalkyl group, a cycloalkenyl group, and a cycloalkynyl group). The alkyl group etc. may have one or more other substituents. For example, the alkyl group etc. may have a substituent comprising an atom other than a carbon atom or a hydrogen atom as a substituent. Also, the alkyl group etc. may comprise one or more atoms other than a carbon atom or a hydrogen atom in a chain structure or a cyclic structure. Examples of the atoms other than a carbon atom or a hydrogen atom above include one or more of an oxygen atom, a nitrogen atom, a sulfur atom, a phosphorus atom, and a silicon atom.

Specific examples of the alkyl group include a methyl group, an ethyl group, an n-propyl group, an i-propyl group, an n-butyl group, an i-butyl group, a sec-butyl group, a t-butyl group, a pentyl group, an isopentyl group, a neopentyl group, a hexyl group, a heptyl group, an octyl group, and a 2-ethylhexyl group. Specific examples of the cycloalkyl group include a cyclopentyl group, a cyclohexyl group, a cycloheptyl group, and a 2-methylcyclohexyl group. Examples of the alkenyl group include a vinyl group, an allyl group, and an isopropenyl group. Specific examples of the cycloalkenyl group include a cyclohexenyl group. Specific examples of the 2-methylene-1,3-dicarbonyl compound include dibutyl methylene malonate, dipentyl methylene malonate, dihexyl methylene malonate, dicyclohexyl methylene malonate, ethyl octyl methylene malonate, propyl hexyl methylene malonate, 2-ethylhexyl-ethyl methylene malonate, ethylphenyl-ethyl methylene malonate and the like. These are preferable because of their low volatility and high reactivity. In view of ease of handling, dihexyl methylene malonate and dicyclohexyl methylene malonate are particularly preferable.

When the 2-methylene-1,3-dicarbonyl compound is represented by formula (II) or (IV) above and $R^1$ and $R^2$ are both monovalent hydrocarbon groups, it is particularly preferable that $R^1$ and $R^2$ are, each, an alkyl group, a cycloalkyl group, an alkyl-substituted cycloalkyl group, an aryl group, an aralkyl group, or an alkaryl groups having 2 to 8 carbons.

As used herein, a spacer refers to a divalent hydrocarbon group, more specifically a cyclic, linear or branched, substituted or unsubstituted alkylene group. There are no particular restrictions on the carbon number of the alkylene group. The carbon number of the alkylene group is usually 1 to 12, preferably 2 to 10, more preferably 3 to 8, and still more preferably 4 to 8. If desired, the alkylene group may comprise a group comprising a heteroatom selected from N, O, S, P, and Si. The alkylene group may have an unsaturated bond. In an embodiment, the spacer is an unsubstituted alkylene group having 4 to 8 carbon atoms. Preferably, the spacer is a linear, substituted or unsubstituted alkylene group, more preferably, an alkylene group having a structure represented by the formula —$(CH_2)_n$—, wherein n is an integer from 2 to 10, preferably from 4 to 8, and wherein the carbon atoms at both ends are bonded to the remaining moieties of the 2-methylene-1,3-dicarbonyl compound.

Specific examples of the divalent hydrocarbon group for the spacer include, but are not limited to, a 1,4-n-butylene group and a 1,4-cyclohexylene dimethylene group.

If the 2-methylene-1,3-dicarbonyl compound has a spacer, the number of carbon atoms in the terminal monovalent hydrocarbon group is preferably 6 or less. That is, if the 2-methylene-1,3-dicarbonyl compound is represented by formula (II) or (IV) above, it is preferable that $R^4$ in formula (III) or (V) above be alkyl having 1 to 6 carbon atoms, but if either one of $R^1$ and $R^2$ is represented by formula (III) or formula (V) above, it is preferable that the other of $R^1$ and $R^2$ be alkyl having 1 to 6 carbon atoms. In this case, in formula (II) or formula (IV) above, both $R^1$ and $R^2$ may be represented by formula (III) or formula (V) above, and preferably, only either one of $R^1$ and $R^2$ is represented by formula (III) or formula (V) above. Preferably, the 2-methylene-1,3-dicarbonyl compound is represented by formula (IV) above.

Examples of particularly preferable compounds that have a spacer include compounds represented by formula (IV) above, wherein either one of $R^1$ and $R^2$ is any one of an ethyl group, an n-hexyl group or a cyclohexyl group, the other one is represented by formula (V) above, W is either a 1,4-n-butylene group or a 1,4-cyclohexylene dimethylene group, and $R^4$ is any one of an ethyl group, an n-hexyl group or a cyclohexyl group. Further, other particularly preferable compounds include compounds represented by formula (IV) above, wherein $R^1$ and $R^2$ are represented by formula (V) above, W is either a 1,4-n-butylene group or a 1,4-cyclohexylene dimethylene group, and $R^1$ is any one of an ethyl group, an n-hexyl group or a cyclohexyl group.

A variety of 2-methylene-1,3-dicarbonyl compounds are available from Sirrus Inc., Ohio, USA, and synthetic methods thereof are disclosed in publications of patent applications such as WO2012/054616, WO2012/054633 and WO2016/040261L If both ends of the structural unit represented by formula (I) above contained in the 2-methylene-1,3-dicarbonyl compound are bonded to oxygen atoms, 2-methylene-1,3-dicarbonyl compounds having a higher molecular weight in which a plurality of structural units represented by formula (I) above are liked via an ester bond and the spacer above can be produced by using methods known in the art such as the transesterification with a diol or a polyol disclosed in Japanese Translation of PCT International Application Publication No. JP-T-2015-518503. A 2-methylene-1,3-dicarbonyl compound thus prepared may comprise a hydroxy group in $R^1$ and $R^2$ in formula (II) above or formula (IV) above, $R^4$ in formula (III) above or formula (V) above, and $R^{14}$ and $R^{13}$ in formula (VI) above.

The curing agent composition of the present invention comprises a 2-methylene-1,3-dicarbonyl compound described above. Herein, the 2-methylene-1,3-dicarbonyl compound contained in the curing agent composition of the present invention is also referred to simply as "component (b1)."

Component (b1) can be used in the curing agent composition of the present invention, because component (b1), which comprises the structural unit of formula (I) as described above, is incorporated into the polymerization system in the curing reaction with a 2-methylene-1,3-dicarbonyl compound used as the base resin described below.

Component (b1) has a molecular weight of 180 to 10,000, more preferably 180 to 5,000, even more preferably 180 to 2,000, even more preferably 200 to 1,500, even more preferably 240 to 1,500, particularly preferably 250 to 1,500, and most preferably 250 to 1,500. Component (b1) having such molecular weights can be obtained by formulating with suitable ones from the various 2-methylene-1,3-dicarbonyl compounds procured or manufactured (synthesized) as described earlier.

The molecular weight of component (b1) and the amount by mass of each of the compounds constituting component (b1) relative to the entire curing agent composition of 1, can be determined, for example, by means of reverse phase HPLC using an ODS column for the column and a mass spectrometer (MS) for the detector with PDA (detection wavelength: 190 run to 800 nm) or ELSD quantification. If the molecular weight of component (b1) is less than 180, the vapor pressure at 25° C. may be excessively high, which may cause various problems arising from volatiles. In addition, the relatively small steric hindrance that results leads to high reactivity, and a mixture with component (a) cannot have sufficient pot life. By contrast, if the molecular weight of component (b1) exceeds 10,000, it results in the viscosity of the curing agent composition becoming high, which decreases workability and, in addition, causes other issues such as imposing limitations on the amount of fillers that can be added.

Component (b1) may comprise a multifunctional component. Multifunctional herein means that the 2-methylene-1,3-dicarbonyl compound comprises two or more structural units of formula (I) above. The number of structural units of formula (I) contained in a 2-methylene-1,3-dicarbonyl compound is referred to as the "number of functional groups" of the 2-methylene-1,3-dicarbonyl compound. Of the 2-methylene-1,3-dicarbonyl compounds, those for which the number of functional groups is one are called "monofunctional"; those for which the number of functional groups is two are called "bifunctional"; and those for which the number of functional groups is three are called "trifunctional." Since a cured product obtained when using component (b1) comprising a multifunctional component is cross-linked, the cured product has improved physical properties, such as improved heat resistance and improved mechanical properties at high temperatures. When a multifunctional component is used, the ratio by mass of the multifunctional component is preferably 0.01 or greater relative to the entire curing agent composition of the present invention of 1. In an embodiment, the ratio by mass of those in component (b1) that comprise two or more structural units represented by formula (I) above is preferably 0.01 to 1.00, more preferably 0.05 to 0.95, even more preferably 0.05 to 0.90, particularly preferably 0.10 to 0.90, most preferably 0.20 to 0.80, relative to the entire curing agent composition of the present invention of 1.

In an embodiment, the ratio by mass of component (b1) is preferably 0.300 to 0.999, more preferably 0.500 to 0.995, even more preferably 0.700 to 0.999, and particularly preferably 0.800 to 0.999, relative to the entire curing agent composition of the present invention of 1.

This ratio by mass can be measured, for example, by separating the solids from the liquid by extraction or other methods, followed by quantification by reverse phase HPLC as described above.

Component (b1) may undergo polymerization in the presence of component (a) as described above. The curing of the curing agent composition of the present invention that arises from this, however, occurs at a very low rate, and the curing agent composition of the present invention is, therefore, effectively stable at room temperature for a period of time and remains suitable for use as a curing agent. The curing agent and the base resin of a two-part mixing adhesive may be stored at low temperatures (e.g., −20° C. or lower) to prevent changes in viscosity. In this case, they are typically returned to room temperature (e.g., about 25° C.) first and then subjected to mixing, dispensing, and other operations. In a process of manufacturing electronic devices, these operations are often carried out at room temperature continuously for about 5 to 12 hours. Therefore, it is desirable that the viscosity of the curing agent and the base resin remain low and stable during this period. In view of workability such as mixability and dispensability, the curing agent composition of the present invention preferably has a viscosity of 1,000 Pa·s or lower, more preferably 500 Pa·s or lower, and even more preferably 100 Pa·s or lower, on being kept at a temperature of 25° C. for 5 hours and as measured by an E-type viscometer. The viscosity on being kept for 12 hours as measured by an F-type viscometer is preferably 1,000 Pa·s or lower, more preferably 500 Pa·s or lower, and even more preferably 100 Pa·s or lower. If the viscosity under the aforementioned conditions exceeds 1,000 Pa·s, mixing, dispensing and other operations become significantly difficult, which is not desirable in practice. The viscosity of the curing agent composition can be measured in any suitable manner, and, for example, it can be measured by keeping its temperature at 25±2° C. and using an E-type viscometer (TVE, an EID type viscometer; cone: 3°×R9.7; manufactured by Toki Sangyo Co., Ltd.) under the condition of 1 rpm. Also, confirmation that it is at least over 1,000 Pa·s can be obtained from an observation that the curing agent composition shows no obvious changes in shape under gravity for 10 seconds after a borosilicate glass screw tube bottle filled with the curing agent composition to about half its capacity is rapidly turned horizontal from a vertical position.

Since the rate of polymerization of component (b1) depends on the interaction between component (b1) and component (a), component (b1) is selected so that this rate of polymerization is suitable. In an embodiment, those having the structure of formula (11) above, in particular, those wherein $R^1$ and $R^2$ are both monovalent hydrocarbon groups having 4 to 12 carbons are used for component (b1). This results in a suitable polymerization rate, especially when using preferable embodiments of component (a) discussed above. Preferably, component (b1) has the structure of formula (IV) above, wherein $R^1$ and $R^2$ are both monovalent hydrocarbon groups having 4 to 12 carbons, more preferably 5 to 10 carbons.

Specific examples of component (b1) that are preferable include dipentyl methylene malonate, dicyclopentyl methylene malonate, dihexyl methylene malonate, dicyclohexyl methylene malonate, dioctyl methylene malonate, bis(2-ethylhexyl) methylene malonate and the like. These are preferable because of their low volatility and because they result in a suitable polymerization rate when using preferable embodiments of component (a) discussed above. In view of ease of handling, dihexyl methylene malonate and dicyclohexyl methylene malonate are particularly preferable.

The curing agent composition of the present invention can be used to cure a 2-methylene-1,3-dicarbonyl compound, discussed above, provided separately from the composition. The curing agent composition of the present invention, therefore, is suitable for curing a base resin comprising at least one 2-methylene-1,3-dicarbonyl compound, discussed above. In the present invention, the "base resin" means a 2-methylene-1,3-dicarbonyl compound or a composition comprising at least one 2-methylene-1,3-dicarbonyl compound, discussed above.

Also provided in the present invention is a curing agent composition for curing a base resin comprising at least one 2-methylene-1,3-dicarbonyl compound. Also provided in the present invention is use of the curing agent composition of the present invention for curing a base resin comprising at least one 2-methylene-1,3-dicarbonyl compound.

In cases where the curing agent composition of the present invention is used to cure a base resin comprising a 2-methylene-1,3-dicarbonyl compound, the at least one 2-methylene-1,3-dicarbonyl compound contained in the base resin is also referred to herein as "component (b2)."

The 2-methylene-1,3-dicarbonyl compounds that may be used as component (b2) are as described above, and there are no particular restrictions as long as they are compounds comprising at least one structural unit of formula (I) above. Component (b2) may be one or more types, and may comprise a multifunctional component. In cases where the curing agent composition of the present invention is used to cure a base resin comprising component (b2), however, the 2-methylene-1,3-dicarbonyl compounds used as component (b2) comprise at least one 2-methylene-1,3-dicarbonyl compound that is different from those in component (b1). Various properties of component (b2), such as molecular weight and the amount contained, can be measured by the same means as in the case of component (b1).

Component (b2), like component (b1), polymerizes in the presence of component (a), but its polymerization rate is much higher than that of component (b1). For example, when 10 g of diethylbenzylamine is added to 100 g each of components (b1) and (b2) at the same time, component (b2) cures faster, with the viscosity of its mixture reaching 1,000 Pa·s first. This means that induction of polymerization by component (a) occurs more easily in component (b2) than in component (b1). Therefore, when the curing agent composition of the present invention comprising components (a) and (l) is mixed with a base resin comprising component (b2), component (a) reacts preferentially with component (b2) to generate reactive chemical species derived from component (b2). These reactive chemical species also induce the reaction of component (b1), and as a result, the copolymerization of components (b1) and (b2) proceeds.

A mixture obtained by mixing the curing agent composition of the present invention with a base resin comprising component (b2) cures within a certain suitable time. If the rate of homopolymerization of component (b2) is slower than the rate of homopolymerization of component (b1), the mixture will not cure within a certain time.

Since the rate of polymerization of component (b2), as in the case of component (b1), depends on the interaction between component (b2) and component (a), component (b2) is selected so that this rate of polymerization is suitable. In an embodiment, those having the structure of formula (II) above, in particular, those wherein $R^1$ and $R^2$ are both monovalent hydrocarbon groups having 1 to 8 carbons are used for component (b2). This results in a suitable polymerization rate, especially when using preferable embodiments of component (a) discussed above. Preferably, component (b2) comprises at least one compound having the structure of formula (IV) above, wherein $R^1$ and $R^2$ are both monovalent hydrocarbon groups having 2 to 7 carbons, more preferably 2 to 6 carbons.

In conventional two-part mixing adhesives, two compounds each having a functional group different from each other (bond-forming reactions between them are expected) may be used as the base resin and the curing agent. In this case, if the mixing ratio of the base resin and the curing agent changes, giving rise to a difference in terms of chemical equivalent between them, then there will be an excess of one of the functional groups over the other, and the functional group in excess will not be involved in the reaction. If none of the functional groups in a molecule is involved in the reaction, the molecule will not be incorporated into the polymerization system and will remain in the cured product as an unreacted component that may cause, among other concerns, bleeding by separating from the cured product. When a compound having only one functional group in a molecule is used, there is a particularly increased possibility that variability in compositional makeup will produce an unreacted component. By contrast, the curing reaction between the component (b1) contained in the curing agent composition of the present invention and the component (b2) contained in the base resin is a reaction between the same functional groups. It follows that this reaction does not involve the difference in terms of chemical equivalent described above, and, accordingly, even if the mixing ratio of the base resin and the curing agent changes to some extent, the effect of unreacted components on the properties of the cured product is insignificant.

Specific examples of component (b2) that are preferable include dihexyl methylene malonate, dicyclohexyl methylene malonate, and diethyl methylene malonate. These are preferable due to their low volatility and high reactivity.

Component (b2) may comprise a multifunctional component. Since a cured product obtained using component (b2) comprising a multifunctional component is cross-linked, the cured product has improved physical properties, such as improved heat resistance and improved mechanical properties at high temperatures. When a multifunctional component is used, the ratio by mass of the multifunctional component is preferably 0.01 or greater relative to the entirety of component (b2) of 1. In an embodiment, the ratio by mass of those 2-methylene-1,3-dicarbonyl compounds that comprise two or more structural units represented by formula (I) above is preferably 0.01 to 1.00, more preferably 0.05 to 0.95, even more preferably 0.05 to 0.90, particularly preferably 0.10 to 0.90, most preferably 0.20 to 0.80, relative to the entirety of component (b2) of 1.

If component (b1) and/or component (b2) comprises a multifunctional component, a network-like cross-linked structure is formed in the cured product, with the result that the cured product does not flow and maintains a constant storage modulus even at high temperatures, in particular, at temperatures above its glass transition temperature. The storage modulus of the cured product at high temperatures can be measured, for example, by dynamic mechanical analysis (NIA). Typically, if a cured product having a cross-linked structure formed therein is measured by DMA, a region known as a plateau is observed over a wide temperature range above its glass transition temperature where changes in storage modulus are relatively small as the temperature changes. The storage modulus in this plateau region is evaluated as a quantity related to crosslink density, i.e., the proportion of the multifunctional component in components (b1) and (b2).

Methods of curing a base resin comprising component (b2) using the curing agent composition of the present invention include a method comprising bringing this base resin into contact with the curing agent composition of the present invention. If desired, this method may further comprise, after bringing them into contact, mixing the base resin and curing agent composition that have been brought into contact. In such a method, the ratio by mass of the base resin comprising component (b2) is preferably 0.20 to 5.00, more preferably 0.33 to 3.00, even more preferably 0.50 to 2.00, particularly preferably 0.70 to 1.40, and most preferably 0.80 to 1.20, relative to the entire curing agent composition of the present invention of 1. As will be described later, in such a method, the ratio by mass or volume of the base resin comprising component (b2) relative to the entire curing agent composition of the present invention of 1 is particularly favorably about 1, because this will eliminate mistakes such as mixing up their amounts.

In an embodiment, the ratio by mass of component (b2) is preferably 0.300 to 1, more preferably 0.500 to 1, even more preferably 0.700 to 1, and particularly preferably 0.800 to 1 relative to the entire base resin of 1.

The curing agent composition of the present invention and the base resin comprising component (b2) are both applied to an adherend using, for example, a dispenser. Contact between the curing agent composition of the present invention and the base resin comprising component (b2) may be made, for example, by using a dispensing device to collide independently discharged droplets on the adherend. The mixing above may be performed in a mixing nozzle that is associated with the dispenser and has a structure in which two flow paths are combined into one flow path. The adherend above is preferably an electronic component. The method of curing a base resin comprising component (b2) using the curing agent composition of the present invention may comprise heating the mixture after bringing them into contact or mixing them. The heating is carried out, for example, by heating the mixture to a temperature of 25 to 80° C. and the heating time is, for example, preferably 0.5 to 4 hours.

In a certain embodiment of the method of curing a base resin comprising component (b2) using the curing agent composition of the present invention, this base resin is applied to an electronic component after being brought into contact with the curing agent composition of the present invention, or this base resin is brought into contact with the curing agent composition of the present invention on the electronic component. The electronic component can be adhered or sealed in this way. In an embodiment, the bringing into contact means mixing.

Preferable embodiments of component (b2) in the method of curing a base resin comprising component (b2) using the curing agent composition of the present invention are as described above. Preferable embodiments of components (a) and (b1) in this method are the same as those for the curing agent composition described above.

[Two-Part Mixing Adhesive]

A combination of the curing agent composition of the present invention with a base resin comprising at least one 2-methylene-1,3-dicarbonyl compound, discussed above, (component (b2)) provides a two-part mixing adhesive. In the present invention, an "adhesive" means a liquid substance that is curable, wherein when the liquid substance is cured on a solid body to give a cured product, the cured product adheres to the solid body. In the present invention, therefore, "adhesives" encompass not only adhesives in the narrow sense of the word but also sealing materials, caulking agents and the like, and preferably refer to adhesives in the narrow sense and sealing materials. Therefore, it is also possible to use the two-part mixing adhesive of the present invention as a sealing material to seal an electronic component and the like.

In an embodiment, the ratio by mass of component (b2) is preferably 0.300 to 1, more preferably 0.500 to 1, even more preferably 0.700 to 1, and particularly preferably 0.800 to 1, relative to the entire base resin of 1.

In the two-part mixing adhesive described above, the ratio by mass of the base resin comprising component (b2) is preferably 0.20 to 5.00, more preferably 0.33 to 3.00, even more preferably 0.50 to 2.00, particularly preferably 0.70 to 1.40, and most preferably 0.80 to 1.20, relative to the entire curing agent composition of 1. One way to avoid the improper mixing described above of the curing agent and the base resin of a two-part mixing adhesive is to set the mixing ratio of the curing agent and the base resin to about 1:1 (ratio by mass or ratio by volume). This will allow mixing at improper ratios to be avoided. Furthermore, it allows the desired curability and the desired properties of the cured product to be obtained even if the actual ratio between the curing agent composition and the base resin differs slightly from the desired ratio.

If the curing agent composition of the present invention comprising components (a) and (b1) is used in combination with a base resin comprising component (b2), it enables the mixing ratio of the curing agent composition and the base resin to be adjusted to suit the application. For example, setting the mixing ratio of the curing agent composition and the base resin to 1:1 (ratio by mass or ratio by volume) by adjusting the compositional makeups as needed will allow mixing at improper ratios to be avoided as described above. This also simplifies the operations involved in checking the mixing ratio, thereby improving work efficiency.

In both the curing agent composition and the base resin, the proportion of the liquid components that do not contribute to curing is preferably low. This is because if the proportion of the liquid components that do not contribute to curing (e.g., diluting solvents, coupling agents, plasticizers, anti-foaming agents) is too high, it may cause undesirable phenomena such as outgassing (volatiles) and bleeding. Phenomena likes these lead to issues such as contamination around the adhesion site and degradation of adhesion characteristics, which are particularly problematic in the adhesion of small components. The ratio by mass of the liquid components that do not contribute to curing discussed above is preferably 0.00 to 0.10, more preferably 0.00 to 0.05, even more preferably 0.00 to 0.02, and particularly preferably 0.00 to 0.01, relative to the entire curing agent composition or the base resin of 1.

A liquid component is a component that is liquid in the curing agent composition and the base resin, including, for example, a component that is dissolved in component (b1) or (b2), or a component that is not dissolved but is dispersed in the form of droplets. In an embodiment, the liquid components that do not contribute to curing refer to the liquid components that are not component (a), component (b1) or component (b2).

In the two-part mixing adhesive described above, both the curing agent composition and the base resin are maintained at viscosities suitable for mixing and application for a certain period of time.

Preferable embodiments of component (b2) in this two-part mixing adhesive are as described above. Preferable embodiments of components (a) and (b1) in this two-part mixing adhesive are the same as those for the curing agent composition described above.

The curing agent composition of the present invention and the base resin to be combined therewith may, as necessary, comprise, in addition to the components described above, a filler, stabilizer, a surface treatment agent such as a coupling agent, a pigment, a plasticizer, or the like. The curing agent composition of the present invention and the base resin to be combined therewith can be prepared by mixing these components. Apparatuses known in the art can be used for mixing. For example, mixing can be performed by apparatuses known in the art such as a Henschel mixer or a roll mill. These ingredients may be mixed simultaneously, or it may be such that some are mixed first, and the remainder are mixed later.

The curing agent composition of the present invention and the base resin to be combined therewith may comprise components other than those described above, such as, for example, a flame retardant, an ion trapper, an antifoaming agent, a leveling agent, a foam breaker, etc. as long as they do not impair the effectiveness of the present invention.

The two-part mixing adhesive comprising the curing agent composition of the present invention and the base resin is preferably for electronic components. Specifically, this adhesive is suitable for adhering and sealing electronic components. In the present invention, an electronic component adhered using this adhesive is also provided. Furthermore, an electronic component sealed using this adhesive is also provided.

The two-part mixing adhesive may be cured at room temperature without heating. This adhesive may also be cured by heating, for example, at a temperature of 25 to 80° C.

EXAMPLES

Examples and comparative examples of the present invention will be described below. The present invention is not limited to the following Examples and Comparative Examples. In the following Examples and Comparative Examples, the amounts of components contained in compositions and adhesives are indicated in terms of mass (unit: g).

[Calculating Vapor Pressures]

Vapor pressures at various temperatures were calculated for embodiments of the 2-methylene-1,3-dicarbonyl compound used in the present invention, using HSPiP (5th Edition 5.0.04, Y-MB method). Table 1 shows the vapor pressures (unit: mmHg) at various temperatures for diethyl methylene malonate (DEIM), ethyl propyl methylene malonate (EPrMM), dipropyl methylene malonate (DPrMVM), butyl pentyl methylene malonate (BPeMM), dipentyl methylene malonate (DPeMM), dihexyl methylene malonate (DH MM), and dicyclohexyl methylene malonate (DCHIMM).

TABLE 1

| Sample | Molecular Weight | Temperature [° C.] | | | | | |
|---|---|---|---|---|---|---|---|
| | | 25 | 50 | 80 | 100 | 120 | 150 |
| DEMM | 172.2 | 0.0648 | 0.5542 | 4.2095 | 12.7600 | 33.3400 | 113.1 |
| EPrMM | 186.2 | 0.0217 | 0.2205 | 1.9453 | 6.3700 | 17.7500 | 65.0800 |
| DPrMM | 200.2 | 0.0077 | 0.0928 | 0.9473 | 3.3444 | 9.9167 | 39.2200 |
| BPeMM | 242.3 | 0.0002 | 0.0039 | 0.0705 | 0.3343 | 1.2634 | 6.6901 |
| DPeMM | 256.3 | 0.0000 | 0.0010 | 0.0243 | 0.1307 | 0.5482 | 3.2830 |
| DHMM | 284.4 | 0.0000 | 0.0001 | 0.0024 | 0.0174 | 0.0925 | 0.7308 |
| DCHMM | 280.4 | 0.0000 | 0.0000 | 0.0009 | 0.0064 | 0.0340 | 0.2722 |

[Preparing Curing Agent Compositions]

The raw materials for the curing agent compositions used in the Examples and Comparative Examples below are as follows.

Initiator (Component (a))

DEBA Diethylbenzylamine (Wako Pure Chemical Industries, Ltd., Molecular weight: 165.3)

In the Examples and Comparative Examples below, the following 2-methylene-1,3-dicarbonyl compounds were used singly or in combination of two compounds.

2-Methylene-1,3-dicarbonyl compounds (Component (b1))

DEMM (manufactured by Sirrus Inc., molecular weight: 172.2)
DHIMM (manufactured by Sirrus Inc., molecular weight: 284.4)
DCHMM (manufactured by Sirrus Inc., molecular weight: 280.4)

The chemical structures of these compounds are shown in Table 2 below.

TABLE 2

| | | |
|---|---|---|
| DEMM | Diethyl methylene malonate | [structure] |
| DCHMM | Dicyclohexyl methylene malonate | [structure] |
| DHMM | Dihexyl methylene malonate | [structure] |

The aforementioned components (a) and (b1) were placed in a borosilicate glass screw tube bottle in the mass ratios shown in Table 3. The bottle was shaken vigorously for 3 minutes at room temperature (25° C.) to thoroughly mix the contents. The time elapsed from the completion of this mixing till the substance in the screw tube bottle practically lost fluidity accompanied by a clear release of heat (gel time) was measured at room temperature (25° C.). The results are shown in Table 3.

Here, the expression "practically loses fluidity" refers to a state in which the substance that fills the screw tube bottle to about half its capacity is immobilized on the inner wall of the bottle and no obvious change in shape is observed under gravity for 10 seconds after the bottle is rapidly turned horizontal from a vertical position. If the substance has practically lost fluidity in this sense, its viscosity can be determined to be at least over 1,000 Pa·s. By contrast, if clear fluidity is observed such as an instant deformation of the substance upon undergoing the procedure above, its viscosity can be determined to be at most 1,000 Pa·s or lower.

TABLE 3

| | | Example 1 | Example 2 | Example 3 | Comparative Example 1 |
|---|---|---|---|---|---|
| Component (a) | DEBA | 0.04 | 0.04 | 0.04 | 0.06 |
| Component (b1) | DEMM | | | | 2.94 |
| | DHMM | 2.96 | | 1.48 | |
| | DCHMM | | 2.96 | 1.48 | |
| Total | | 3.00 | 3.00 | 3.00 | 3.00 |
| Gel time (min) | | >720 | >720 | >720 | 45 |

(Discussion on Results)

The curing agent compositions in which an amine compound that has a high basicity ($pK_a$ value of 8.0 or higher) and, as a whole molecule, displays relatively high steric hindrance is combined with a component (b1) having relatively high steric hindrance near the reactive moiety showed low curing rates. Their viscosities were determined to have remained lower than 1,000 Pa·s even 12 hours after preparation when they were kept at 25° C., based on the observation that the curing agent compositions were clearly fluid (Examples 1 to 3).

By contrast, the curing agent composition in which the same amine compound was combined with a component (b1) that has relatively small steric hindrance near the reactive moiety showed an excessively high curing rate. Its viscosity was determined to have reached 1,000 Pa·s in less than 12 hours after preparation when it was kept at 25° C., based on the observation that the curing agent composition practically lost fluidity (Comparative Example 1).

[Base Resin]

In the following Examples and Comparative Examples, the 2-methylene-1,3-dicarbonyl compound (component (b2)) was used as a base resin, which was cured using the curing agent composition of Example 1 above. For component (b2), the compound used as component (b1) in Comparative Example 1 above was used by itself.

The curing characteristics of a two-part mixing adhesive consisting of the curing agent composition of Example 1 above and the component (b2) described above, serving as the base resin, were evaluated by measuring its gel time at room temperature (25° C.) in the same manner as in the evaluation of the curing characteristics for the curing agent compositions described above.

The amounts of the curing agent composition and the base resin used (unit: g), as well as the measured gel time, are shown in Table 4.

TABLE 4

|  |  | Example 4 |
| --- | --- | --- |
| Component (b2) | DEMM | 1.50 |
| Curing agent | Example 1 | 1.50 |
| Total |  | 3.00 |
| Gel time (min) |  | 105 |

Discussion on Results

The two-part mixing adhesive comprising a base resin in the form of a component (b2) having relatively small steric hindrance near the reactive moiety showed a moderate curing rate. When the mixture obtained by mixing the curing agent composition with the base resin was kept at 25° C., its viscosity was determined to have remained lower than 1,000 Pa·s 60 minutes after the mixing, based on the observation that the mixture was clearly fluid, and its viscosity was determined to have reached 1,000 Pa·s in less than 120 minutes, based on the observation that the mixture practically lost fluidity (Example 4).

Example 5

The same operating procedures as in Example 4 will be performed, except that the mass of the curing agent composition is changed to 1.51 g and the mass of component (b2) is changed to 1.49 g. The gel time will be almost the same as in Example 4.

Example 6

The same operating procedures as in Example 4 will be performed, except that the mass of the curing agent composition is changed to 1.49 g and the mass of component (b2) is changed to 1.51 g. The gel time will be almost the same as in Example 4.

Comparative Examples 2 to 4

A mixture of 1.48 parts by mass of DHMM and 1.50 parts by mass of DEMM will be prepared and used to prepare the following three compositions:
Comparative Example 2: Composition obtained by adding 0.02 g of DEBA to 2.98 g of the mixture above
Comparative Example 3: Composition obtained by adding 0.03 g of DEBA to 2.97 g of the mixture above
Comparative Example 4: Composition obtained by adding 0.01 g of DEBA to 2.99 g of the mixture above.

For each of the three compositions above, the gel time at room temperature (25° C.) will be measured in the same manner as in the evaluation of the curing characteristics for the curing agent compositions described above. In Comparative Example 3, the gel time of the composition will be significantly shorter than that of Comparative Example 2, and in Comparative Example 4, the gel time of the composition will be significantly longer than that of Comparative Example 2.

Discussion on Results

Compositions obtained by adding an amine compound to a mixture of component (b1) and component (b2) will show significant variation in curing time, due to variations in the amounts mixed that are about as small as within the tolerance range of a measuring instrument. In contrast, the curing time of the two-part mixing adhesive of the present invention will be hardly affected, even if the amounts of the curing agent composition and the base resin mixed vary to about the same extent. Therefore, the two-part mixing adhesive of the present invention is conducive to consistent performance of adhesion and other operations.

INDUSTRIAL APPLICABILITY

The curing agent composition of the present invention remains liquid without curing for a long time, but when this composition is mixed with a base resin comprising a 2-methylene-1,3-dicarbonyl compound, the resulting mixture cures in a suitable curing time even at relatively low temperatures such as room temperature. The cured product has no liquid components that separate without becoming incorporated into the polymerization system. In other words, the curing agent composition of the present invention, when combined with the base resin described above, provides a two-part mixing adhesive that can be conveniently and effectively used as an adhesive or sealing agent, and, therefore, is extremely useful. In addition, such a two-part mixing adhesive allows the mixing ratio of the curing agent composition and the base resin to be set at any desired level, for example, 1:1 by volume, which enables achievement of the desired curability and the desired properties of the cured product, even if the actual ratio of the curing agent composition and the base resin differs slightly from the desired ratio. Furthermore, the cured product contains no liquid components that separate without being incorporated into the polymerization system, thereby preventing outgassing and bleeding.

What is claimed is:

1. A two-part mixing adhesive kit, wherein:
(i) a first part of the two-part mixing adhesive kit includes a curing agent composition comprising:
(a) an initiator comprising at least one basic substance, and
(b1) at least one first 2-methylene-1,3-dicarbonyl compound having a molecular weight of 180 or higher and 10,000 or lower, the first 2-methylene-1,3-dicarbonyl compound comprising at least one structural unit represented by formula (I), and
(ii) a second part of the two-part mixing adhesive kit includes a base resin comprising (b2) at least one second 2-methylene-1,3-dicarbonyl compound, the second 2-methylene-1,3-dicarbonyl compound comprising at least one structural unit represented by formula (I), and
wherein formula (I) is

2. The two-part mixing adhesive kit according to claim 1, wherein the component (a) has a $pK_a$ of 8.0 or higher.
3. The two-part mixing adhesive kit according to claim 1, wherein the component (a) is an amine compound.
4. The two-part mixing adhesive kit according to claim 1, wherein the component (a) is a tertiary amine compound.
5. The two-part mixing adhesive kit according to claim 1, wherein the component (a) is at least one tertiary amine compound represented by the formula NRR'R", wherein R and R' are each, independently, a methyl group or an ethyl group, and R" is a monovalent hydrocarbon group having two or more carbon atoms.

6. The two-part mixing adhesive kit according to claim 1, wherein the curing agent composition has a viscosity of 1,000 Pa·s or lower upon being maintained at 25° C. for 12 hours.

7. The two-part mixing adhesive kit according to claim 1, wherein the component (b2) comprises at least one 2-methylene-1,3-dicarbonyl compound that is different from any 2-methylene-1,3-dicarbonyl compound in the component (b1).

8. A method for curing a base resin, comprising:
bringing the base resin into contact with a curing agent composition,
wherein the curing agent composition comprises: (a) an initiator comprising at least one basic substance, and (b1) at least one first 2-methylene-1,3-dicarbonyl compound having a molecular weight of 180 or higher and 10,000 or lower, the first 2-methylene-1,3-dicarbonyl compound comprising at least one structural unit represented by formula (I),
wherein the base resin comprises (b2) at least one second 2-methylene-1,3-dicarbonyl compound, the second 2-methylene-1,3-dicarbonyl compound comprising at least one structural unit represented by formula (I), and wherein formula (i) is

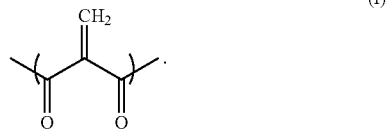

9. The method according to claim 8, wherein the component (a) has a $pK_a$ of 8.0 or higher.

10. The method according to claim 8, wherein the component (a) is an amine compound.

11. The method according to claim 8, wherein the component (a) is a tertiary amine compound.

12. The method according to claim 8, wherein the component (a) is at least one tertiary amine compound represented by the formula NRR'R", wherein R and R' are each, independently, a methyl group or an ethyl group, and R" is a monovalent hydrocarbon group having two or more carbon atoms.

13. The method according to claim 8, wherein the curing agent composition has a viscosity of 1,000 Pa·s or lower upon being maintained at 25° C. for 12 hours.

14. The method according to claim 8, wherein the component (b2) comprises at least one 2-methylene-1,3-dicarbonyl compound that is different from any 2-methylene-1,3-dicarbonyl compound in the component (b1).

* * * * *